(12) United States Patent
    Kim et al.

(10) Patent No.: US 12,597,751 B2
(45) Date of Patent: Apr. 7, 2026

(54) LASER-INDUCED GRAPHENE DEVICE BUILT ON WOOD, AND FABRICATION METHOD THEREOF

(71) Applicant: KOREA ADVANCED INSTITUTE OF SCIENCE AND TECHNOLOGY, Daejeon (KR)

(72) Inventors: Young-Jin Kim, Daejeon (KR); Han Ku Nam, Daejeon (KR); Dongwook Yang, Daejeon (KR); Youngryeul Kim, Daejeon (KR); Le Dinh Truong Son, Daejeon (KR); Younggeun Lee, Daejeon (KR); Seung-Woo Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 116 days.

(21) Appl. No.: 18/518,692

(22) Filed: Nov. 24, 2023

(65) Prior Publication Data
    US 2024/0190035 A1    Jun. 13, 2024

(30) Foreign Application Priority Data

Dec. 7, 2022    (KR) ........................ 10-2022-0169490
Apr. 25, 2023   (KR) ........................ 10-2023-0054097

(51) Int. Cl.
    *H01S 3/13*        (2006.01)
    *B23K 26/352*      (2014.01)
    (Continued)

(52) U.S. Cl.
    CPC ............ *H01S 3/005* (2013.01); *B23K 26/352* (2015.10); *B27M 1/06* (2013.01); *C01B 32/05* (2017.08);
    (Continued)

(58) Field of Classification Search
    CPC ...... H01S 3/005; H01S 3/0007; H01S 3/0014; H01S 3/0071; H01S 3/10046; H01S 5/34306
    See application file for complete search history.

(56) References Cited

U.S. PATENT DOCUMENTS 11,161,744 B2 *  11/2021  Tour ...................... H01S 3/0007
12,012,336 B2 *   6/2024  Tour ...................... B01D 67/006
                  (Continued)

OTHER PUBLICATIONS

Han Ku Nam et al., "Smart Wooden Home Enabled by Direct-Written Laser-Induced Graphene", Adv. Mater. Technol. 2023, 2201952, Jan. 3, 2023.
(Continued)

*Primary Examiner* — Kinam Park
(74) *Attorney, Agent, or Firm* — LEX IP MEISTER, PLLC

(57) ABSTRACT

A laser system comprises a femtosecond laser, and a beam delivery system configured to deliver and scan a laser beam emanating from the femtosecond laser onto wood, based on a desired graphene design, wherein graphene is formed on the wood by the laser beam. A device capable of being fabricated by the laser system may include a temperature sensor which detects a temperature by measuring resistance of the graphene, a heater or a boiler which converts electrical energy to thermal energy, or electrical interconnects.

6 Claims, 11 Drawing Sheets

(51) Int. Cl.

| | |
|---|---|
| *B27M 1/06* | (2006.01) |
| *C01B 32/05* | (2017.01) |
| *H01S 3/00* | (2006.01) |
| *H01S 3/10* | (2006.01) |
| *H01S 5/343* | (2006.01) |

(52) U.S. Cl.
CPC .......... *H01S 3/0007* (2013.01); *H01S 3/0014* (2013.01); *H01S 3/0071* (2013.01); *H01S 3/10046* (2013.01); *H01S 5/34306* (2013.01)

(56)                    References Cited

U.S. PATENT DOCUMENTS

| | | | |
|---|---|---|---|
| 2021/0332489 A1* | 10/2021 | Claussen .............. | C01B 32/205 |
| 2023/0173419 A1* | 6/2023 | Tour ....................... | B01D 46/84 |
| | | | 55/282.2 |

OTHER PUBLICATIONS

Shu-Wei Wang et al., "Laser-treated wood for high-efficiency solar thermal steam generation", RSC Adv., 2022, 12, 24861-24867, Aug. 2022.

Hansol Jang et al., "Corrugated Wood Fabricated Using Laser-Induced Graphitization for Salt-Resistant Solar Steam Generation", ACS Appl. Mater. Interfaces 2020, 12, 30320-30327, Jun. 9, 2020.

Truong-Son Dinh Le et al., "Green Flexible Graphene Inorganic-Hybrid Micro-Supercapacitors Made of Fallen Leaves Enabled by Ultrafast Laser Pulses", Adv. Funct. Mater. 2022, 32, 2107768, Dec. 2021.

Truong-Son Dinh Le et al., "Ultrafast Laser Pulses Enable One-Step Graphene Patterning on Woods and Leaves for Green Electronics", Adv. Funct. Mater. 2019, 29, 1902771, Jun. 2019.

Yieu Chyan et al., "Laser-Induced Graphene by Multiple Lasing: Toward Electronics on Cloth, Paper, and Food", ACS Nano 2018, 12, 2176-2183, Feb. 13, 2018.

Sara L Silvestre et al., "Cork derived laser-induced graphene for sustainable green electronics", Flex. Print. Electron. 7 (2022) 035021, Sep. 2022.

Ruquan Ye et al.,"Laser-Induced Graphene Formation on Wood", Adv. Mater. 2017, 29, 1702211, Jul. 2017.

Young-Jin Kim et al., "Wood-based flexible graphene thermistor with an ultra-high sensitivity enabled by ultraviolet femtosecond laser pulses", CIRP Annals—Manufacturing Technology 70 (2021) 443-446, Jun. 2021.

Christopher H. Dreimol et al., "Sustainable wood electronics by iron-catalyzed laser-induced graphitization for large scale applications", Nature Communications 13, 3680 (2022), Jun. 2022.

* cited by examiner

FIG. 1

RECEIVE LIG DEVICE DESIGN FOR LASER PATTERNING ON WOODS ~S110

FABRICATE DEVICE PATTERNED WITH GRAPHENE BASED ON DESIRED DESIGN, BY USING BEAM DELIVERY SYSTEM WITH COMPUTER-PROGRAMABLE SCANNER TO DIRECTLY SCAN LASER BEAM OF FEMTOSECOND LASER ONTO WOODS ~S120

LASER-INDUCED GRAPHENE DEVICE BUILT ON WOOD, AND FABRICATION METHOD THEREOF

CROSS-REFERENCE TO RELATED APPLICATION

This application claims priority to and the benefit of Korean Patent Application No. 10-2022-0169490 filed in the Korean Intellectual Property Office on Dec. 7, 2022, and Korean Patent Application No. 10-2023-0054097 filed in the Korean Intellectual Property Office on Apr. 25, 2023, the entire contents of which are incorporated herein by reference.

BACKGROUND

(a) Field

The present disclosure relates to a laser-induced graphene (LIG).

(b) Description of the Related Art

Wood is a naturally abundant, biocompatible, biodegradable, sustainable, renewable, recyclable, and eco-friendly construction material with a rich history spanning thousands of years. Over time, it has gradually given way to alternatives like brick, steel, and concrete. However, with the current surge in eco-friendly construction, wood has regained attention as an attractive building material obtained from nature.

With its lightweight, high strength-to-weight ratio, earthquake safety, ease of renovation, and lower carbon footprint compared to other materials, wood offers numerous advantages. Nonetheless, it does come with some limitations, including high maintenance costs, susceptibility to water leakage, and vulnerability to insect damage. To address these issues, ongoing research is exploring structural densification, carbonization, cellulose nanofiber fabrication, and other innovations to optimize the use of wood. Despite these advancements, the development of next-generation wood-based and eco-friendly technologies that can be seamlessly integrated into our lives still faces challenges. In recent years, the rapid emergence of smart homes, equipped with IoT functionality for monitoring and controlling the home environment, has been notable. However, building interconnectivity with a multitude of electrical sensors for smart homes using wood poses limitations.

SUMMARY

The present disclosure attempts to provide a laser-induced graphene (LIG) device built on wood and a fabrication method thereof.

The present disclosure attempts to provide a fabrication method of an electrical device that may be used in wood construction by converting wood into laser-induced graphene based on femtosecond laser direct-writing (FsLDW), and LIG devices fabricated this way.

In a specific embodiment, the laser system comprises a femtosecond laser, and a beam delivery system designed to deliver and scan the laser beam emanating from the femtosecond laser onto wood. This precise process results in the formation of graphene on the wood, showcasing the capability of the femtosecond laser beam to induce transformative conversion at the molecular level.

According to an embodiment, a laser system comprises a femtosecond laser, and a beam delivery system configured to deliver and scan a laser beam emanating from the femtosecond laser onto wood, based on a desired graphene design. Graphene is formed on the wood by the laser beam.

The femtosecond laser may be a laser outputting a laser pulse with a near-infrared wavelength.

The beam delivery system may creates a outline on a border of graphene electrodes by scanning the laser beam with a low scanning speed than a reference speed, and fill up the graphene on an inside by scanning the laser beam with a high scanning speed than the reference speed.

The graphene electrodes may be designed based on a device type to be patterned on the wood.

The device type may include a temperature sensor which detects a temperature by measuring resistance of the graphene.

The device type may include a heater or a boiler which converts electrical energy to thermal energy by Joule heating method.

The device type may include electrical interconnects.

The wood may include rubberwood, mulbau wood, or bamboo.

According to another embodiment, a fabrication method of a laser-induced graphene (LIG) device, comprises: receiving a desired graphene design of a device to be patterned on wood, and fabricating the device patterned with graphene by using a computer-programmable scanner to directly scan a laser beam of a femtosecond laser onto the wood, based on the desired graphene design.

The femtosecond laser may be a laser outputting a laser pulse with a near-infrared wavelength.

The fabricating may comprise creating a outline on a border of graphene electrodes by scanning the laser beam with a low scanning speed than a reference speed, and filling up the graphene on an inside by scanning the laser beam with a high scanning speed than the reference speed.

The device may include a temperature sensor which detects a temperature by measuring resistance of the graphene.

The device may include a heater or a boiler which converts electrical energy to thermal energy by Joule heating method.

The device may include electrical interconnections.

The wood may include rubberwood, mulbau wood, or bamboo.

According to the embodiment, the femtosecond laser with the near-infrared (NIR) wavelength may be used to form the high-quality LIG with excellent electrical conductivity on the wood in the normal environment without any need for the additional treatment of the wood or the complex procedure.

According to the embodiments, it is possible to use the wood to fabricate the various electrical components such as the temperature sensor, the heater, the boiler, and the electrode replacing the wire, thus making it possible to build an eco-friendly and sustainable smart home.

According to the embodiments, the electric wire may be implemented by mechanically interconnecting the wooden blocks on each of which the LIG is formed without any chemical treatment or conductive adhesive. Therefore, it is possible to simplify the electrical facility in the wood construction, thus lowering the cost. It is also possible to minimize the construction waste such as the wire difficult to be recycled, and activate the development and distribution of the wooden building.

BRIEF DESCRIPTION OF THE DRAWINGS

FIG. 1 is a view for explaining a laser-induced graphene (LIG) device that may be used in wood construction according to an embodiment.

DETAILED DESCRIPTION OF THE EMBODIMENTS

Figure 2:
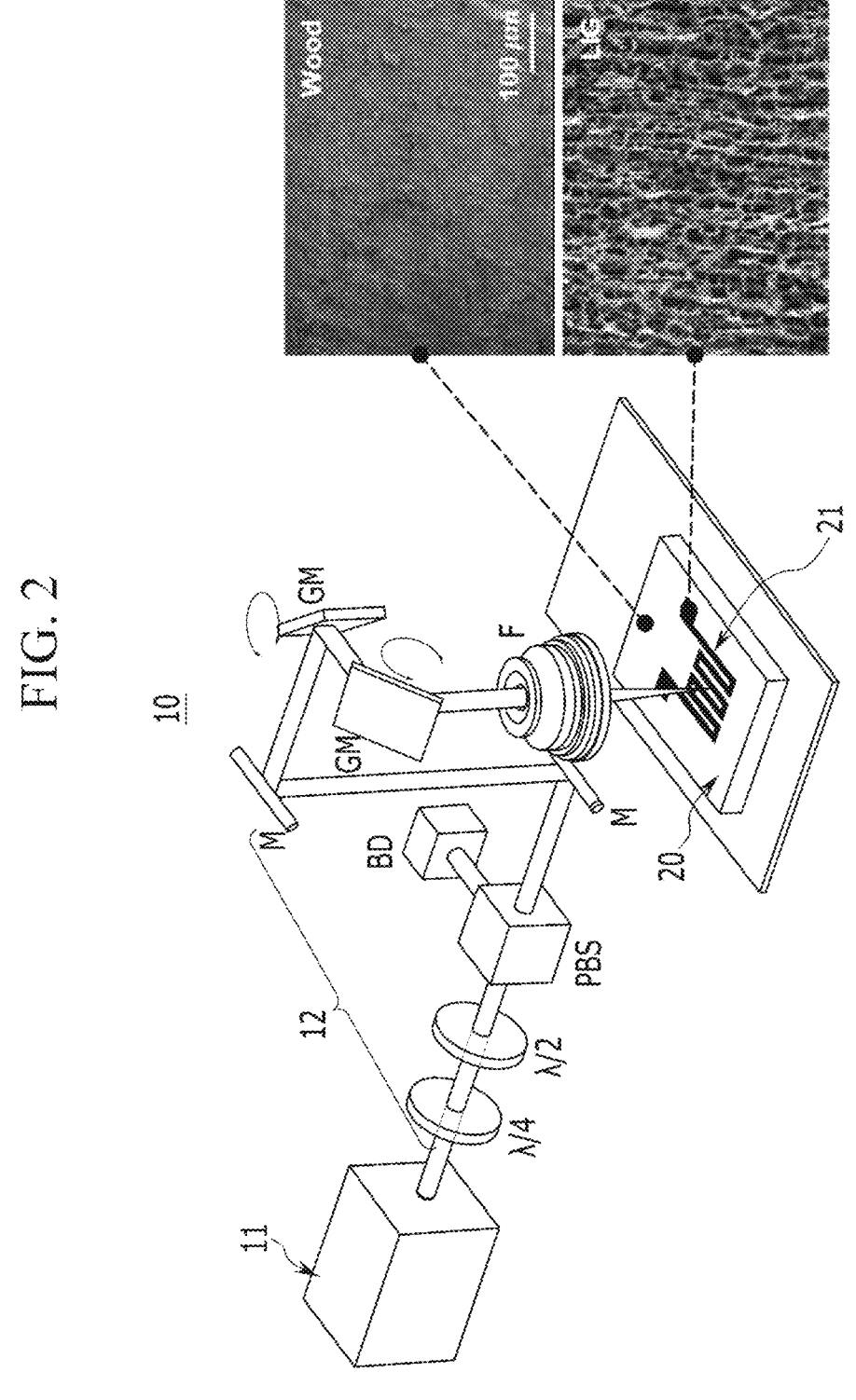
FIG. 2 is a laser system for producing the LIG on wood according to an embodiment.

Hereinafter, embodiments of the present disclosure are described in detail with reference to the accompanying drawings so that those skilled in the art to which the present disclosure pertains may easily practice the present disclosure. However, the present disclosure may be modified in various different forms, and is not limited to the embodiments provided in the specification. In addition, in the drawings, portions unrelated to the description are omitted to clearly describe the present disclosure, and similar portions are denoted by similar reference numerals throughout the specification.

Unless explicitly described to the contrary, "including" any components will be understood to imply the inclusion of other components rather than the exclusion of any other components.

In the description, reference numerals and names are added for convenience of explanation, and devices are not necessarily limited by the reference numerals or the names.

Graphene may refer to a carbon allotrope including a single layer of honeycomb-lattice-shaped carbon atoms, and have a large surface area, high physical/chemical stability, and excellent charge carrier mobility. Several graphene synthesis technologies are reported so far, including chemical vapor deposition (CVD). However, these technologies are unsuitable for mass production because of cost, quality, scalability, yield, and productivity limitations. Recently, laser direct-writing (LDW) technology is studied. The following description describes a fabrication method of various electrical components such as a temperature sensor that may be used in wood construction by building laser-induced graphene (LIG) on wood, and LIG devices fabricated in this way.

Figure 1:
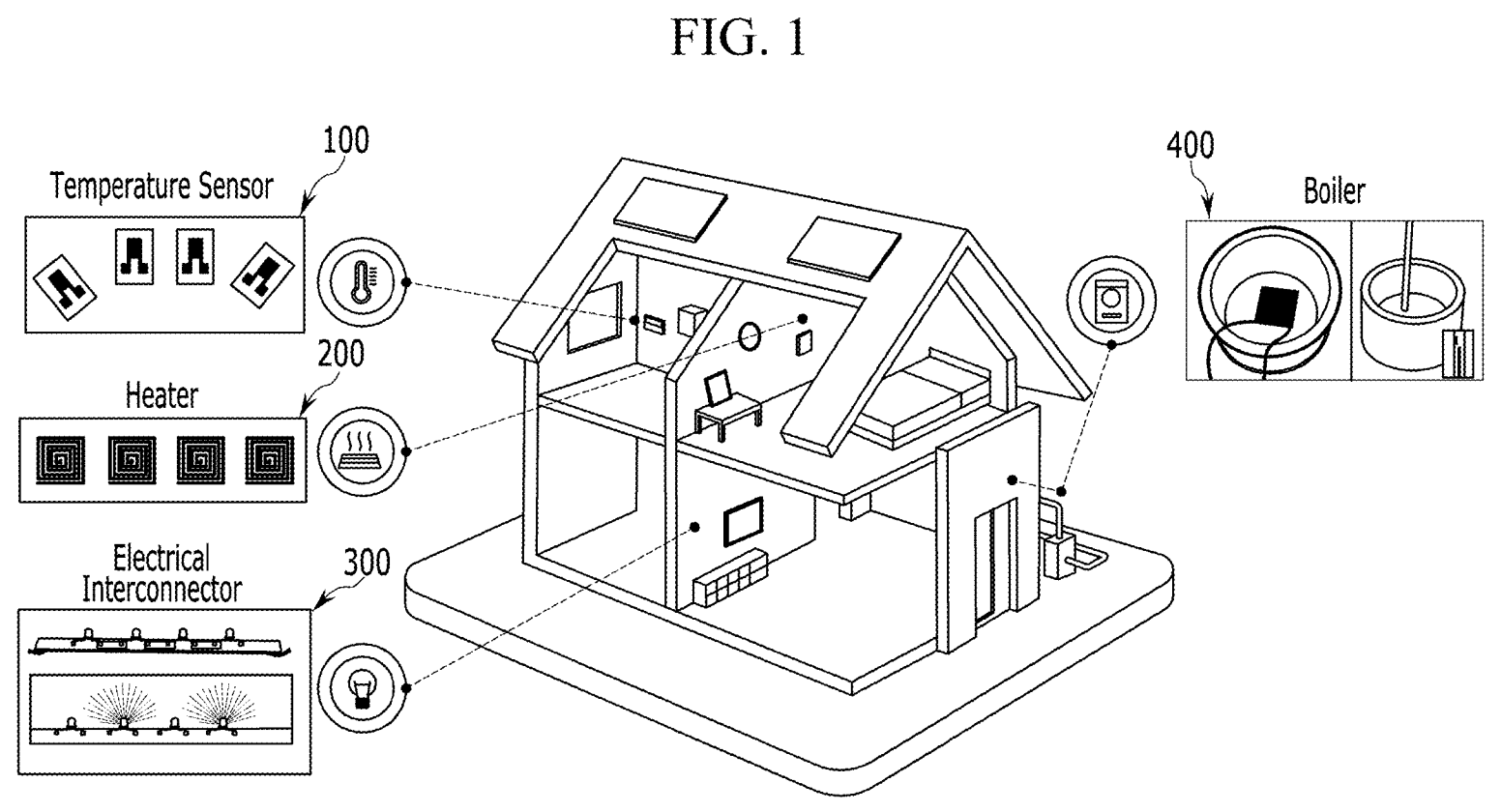

FIG. 1 is a view for explaining a laser-induced graphene (LIG) device that may be used in wood construction according to an embodiment.

Referring to FIG. 1, wood may be a naturally abundant, biocompatible, biodegradable, sustainable, renewable, recyclable and eco-friendly construction material. Wood may have a light weight, a high strength-to-weight ratio, good safety in an earthquake zone, simple renovation, and a low carbon footprint compared to another construction material. Accordingly, wood capable of being obtained from nature is spotlighted as the eco-friendly construction material. Even a wood construction may require an electrical component such as a temperature sensor or an electrode, a heating facility, a hot water facility, or the like. Recently, the wood construction may require the electrode for electrical connection with a large number of internet of things (IOT) sensors to build a smart home where a home environment is monitored and controlled through the IoT.

An electrical device such as a temperature sensor 100, a heater 200, electrical interconnects 300, and a boiler 400 may be fabricated by directly patterning laser-induced graphene (LIG) on wood based on femtosecond laser direct-writing (FsLDW), and the electrical device fabricated in this way may be referred to as an LIG device. Although made of wood, the LIG device may be electrically conductive, and thus be naturally seamlessly used as the electronics in wood construction. In particular, an electric wire may be replaced by directly forming the LIG-based electrical interconnects 300 on a wooden block, and interconnecting mechanically assembled wooden blocks without any chemical treatment or conductive adhesive. It is thus possible to minimize a construction waste such as the wire difficult to be recycled.

The LIG device of the present disclosure may be fabricated using a femtosecond laser. The femtosecond laser may output a pulse train having a high repetition rate and ultrashort pulse duration (e.g., 250 fs), and thus achieve very high peak power by focusing a photon energy of a laser beam in a very short time. Therefore, the femtosecond laser may have significant nonlinearity in an interaction between the laser and a material even in a wavelength band where light is not generally absorbed, and enable effective patterning due to a multiphoton absorption phenomenon. Accordingly, the femtosecond laser may be used for processing a difficult-to-process material. In addition, a femtosecond laser pulse may have a small pulse width, thus minimizing heat transfer to a surrounding material and focusing the photon energy in a narrow area, thereby inducing graphene. That is, when wood is directly scanned by the femtosecond laser pulse, high-quality graphene may be created while appropriately suppressing heat-induced combustion around a fabricated LIG. In addition, irradiation of a femtosecond laser beam by a Galvano scanner may form the graphene of various shapes, and the LIG devices may thus be fabricated to have various sizes and shapes.

FIG. 2 is a laser system for producing the LIG on wood according to an embodiment; and FIGS. 3A to 3D each show analysis results of features of the fabricated LIG according to an embodiment.

Referring to FIG. 2, a laser system 10 may fabricate the LIG device having an electrical feature, such as the temperature sensor 100, the heater 200, the electrical interconnects 300, the boiler 400, or the like, shown in FIG. 1.

The laser system 10 may include a femtosecond laser 11 and a beam delivery system 12 configured to deliver and scan the laser emanating from the femtosecond laser 11. The femtosecond laser 11 with a near infrared (NIR) wavelength may be raster-scanned using a Galvano scanner to pattern an arbitrarily shaped LIG on wood in ambient air. The beam delivery system 12 may include the computer-programmable Galvano scanner, and the wood 20 is irradiated by the femtosecond laser beam according to the desired design. The beam delivery system 12 may be implemented in various ways, and for example, such as a quarter wave plate ($\lambda/4$), a half wave plate ($\lambda/2$), a polarized beam splitter (PBS), a mirror (M), a Galvano mirror (GM), and a F-theta lens (F). Each LIG device may have a different electrical conductivity depending on a device size, device design, or laser power and scanning speed. Therefore, the LIG device may be designed based on purpose of device usages. The laser system 10 may be linked to a computer programmable.

The laser beam output from the femtosecond laser 11 may have its polarization adjusted by the quarter wave plate, the half wave plate, and the polarized beam splitter, and may be expanded using a beam expander. The laser beam may be scanned in a desired design by the computer-programmable Galvano scanner. For high-resolution patterning, the expanded laser beam may be focused using the F-theta lens.

When reviewing scanning electron microscope (SEM) images of the wood 20 and LIG 21, a flat wood surface may be converted into three-dimensional (3D) high-quality graphene having a porous structure after the LIG patterning. The porous LIG structure may provide excellent chemical, physical, or electrical feature, and may offer several advantages in a variety of applications due to its large surface area which promotes rapid ion or electron diffusion. The wood may use a variety of wood species such as rubberwood, mulbau wood, acacia wood, or walnut wood. However, the rubberwood or mulbau wood may be selected which are capable of forming high-quality LIG at a low laser power and a high scanning speed. In addition, the wood may use bamboo.

The LIG device may have a different electrical feature such as electrical conductivity, and also have different thickness and area of the wood that may be fabricated, based on the wavelength and power of the femtosecond laser 11 and the beam scanning speed.

The laser system 10 may directly convert the wood into the LIG without unexpected ablation or damage due to heat by using the femtosecond laser 11 that outputs an ultrashort femtosecond near-infrared pulse at a high repetition rate. For example, an ultraviolet laser may have an increased ablation depth while achieving strong light absorption in the wood. A long pulse laser may accumulate heat on the wood surface, which may cause unexpected ablation or burns. Therefore, forming the LIG by using this type of laser may require either a fire-retardant treatment of the wood or a complex procedure for a beam defocusing technique. In contrast, the femtosecond laser 11 with the NIR wavelength may be used to form the high-quality LIG with excellent electrical conductivity on the wood in a normal environment without additional treatments of the wood or the complex procedure.

A tightly focused ultrashort laser pulse may be absorbed into a wooden board and converted into thermal energy, thus causing a wood surface temperature to be rapidly increased. Therefore, a carbon precursor of the material may be converted to amorphous carbon and finally converted to the LIG through carbonization and graphitization. In general, the wood may have an absorption rate of 20% or less when irradiated with light around 1000 nm NIR wavelength. When a LIG sample is fabricated at an initial high scanning speed of the laser beam, the graphene may not be properly formed in some areas where initial heat is not sufficiently accumulated. When all the LIG samples are created at a low speed, heat may be excessively accumulated to cause thermal damage. Therefore, it is possible to form the high-quality LIG by taking advantage of the fact that the LIG has a high absorption rate in the near-infrared band, that is, by producing an border of the LIG pattern as an LIG outline at the low speed (e.g., 5 to 10 mm/s) than a reference speed for increasing the absorption rate of the near-infrared laser beam, and then patterning the inside of the LIG pattern at the high speed (e.g., 30 to 50 mm/s) than a reference speed. In this way, photon energy may penetrate deeply in a depth direction to create a thick and porous LIG with reducing an ablation depth, which may implement the LIG device with high electrical conductivity such as the sensor, the heater, or the electrode.

For example, the LIG may be patterned on the wood by a laser with a power of 1.0 W and a wavelength of 1,040 nm near-infrared (NIR) and a high scanning speed of 30 mm/s. In this case, it is possible to create high-quality few-layer graphene having low sheet resistance while minimizing the thermal ablation depth. Meanwhile, even when using the same laser power, the LIG may obtain a different structure based on a laser scanning speed. According to an experimental result, the LIG having the highest electrical conductivity may be obtained at a laser scanning speed of 30 to 40 mm/s.

Referring to FIGS. 3A to 3D, the chemical feature of the LIG patterned on the wood may be analyzed using Raman spectroscopy, X-ray diffraction (XRD), X-ray photoelectron spectroscopy (XPS), and thermogravimetric analysis (TGA).

Figure 3A:
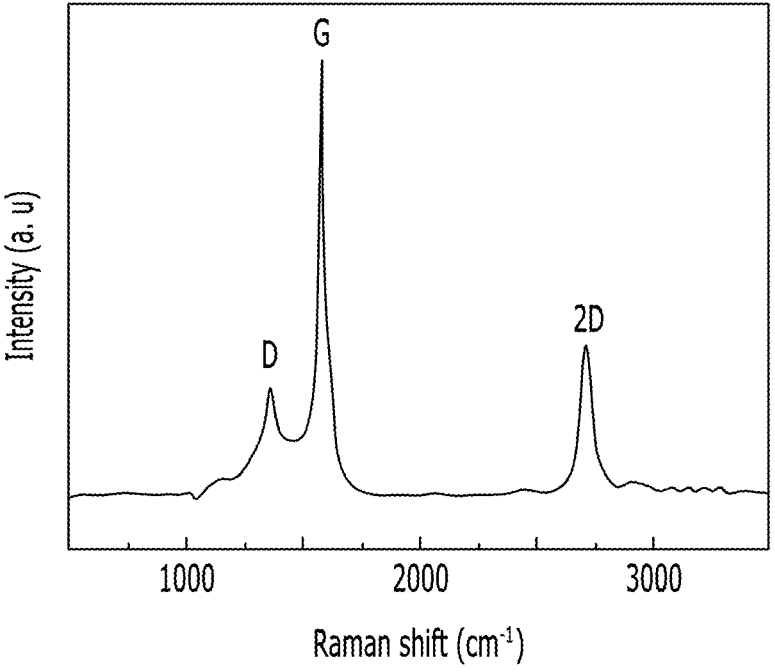
FIGS. 3A to 3D each show analysis results of features of the fabricated LIG according to an embodiment.

Referring to FIG. 3A, an analysis result of Raman spectroscopy shows three sharp peaks appearing at 1356, 1583, and 2706 cm-1, which respectively indicate D, G, and 2D bands. The intensity of the D peak indicates that an amount of defective graphite in the sample is quite low, and the $I_D/I_G$ ratio of 0.25 indicates that graphene having few layers and a highly crystalline structure is formed by irradiation with the femtosecond laser. The 2D peak indicates that the graphene is a few-layer graphene.

Figure 3B:
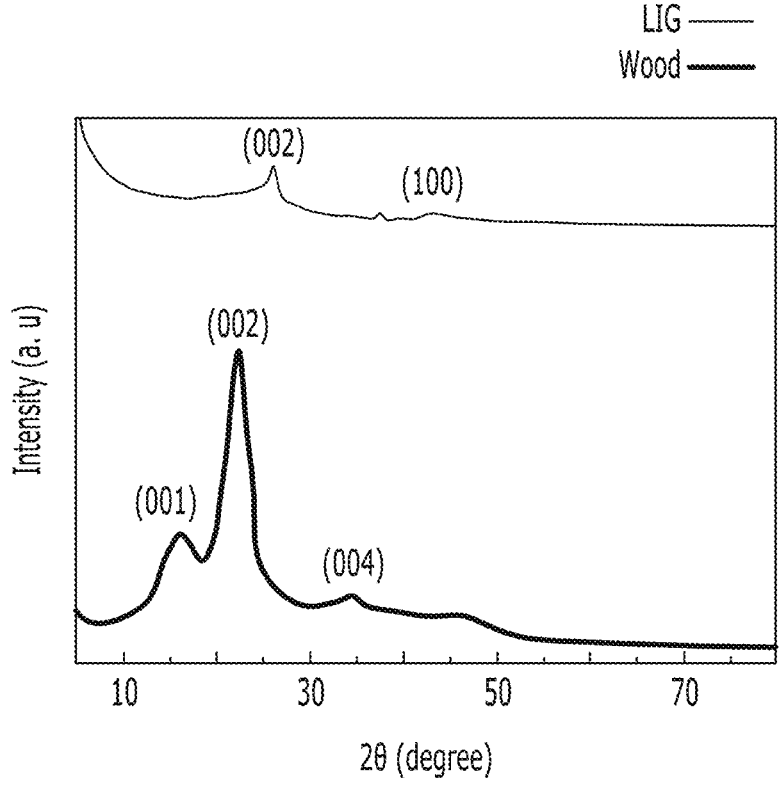

Referring to FIG. 3B, an analysis result of XRD shows a high peak appearing at $2\theta=22.2°$ (002). This peak may be indexed to a lattice plane of carbon in the wood, and replaced by a clear peak at $2\theta=25.9°$ with a 0.34 nm d-spacing after the laser irradiation to form the LIG. The 101 and 040 peaks of the wood are also absent from an XRD pattern of the LIG, which indicates that a wood structure is decomposed and a graphene structure is formed with an interlayer spacing of 0.34 nm between two adjacent lattice planes.

Figure 3C:
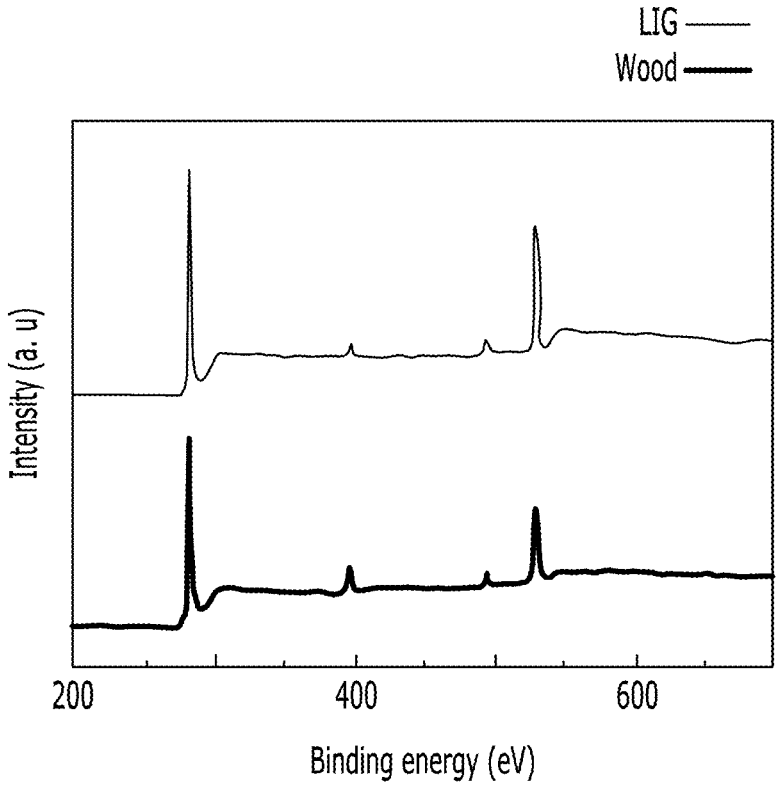

Referring to FIG. 3C, an analysis result of XPS shows that a C/O atomic ratio changes from 4.4 to 6.71 when the wood is converted into the LIG. This result indicates that functional groups containing oxygen are partially removed during the laser irradiation to successfully form the LIG.

Figure 3D:
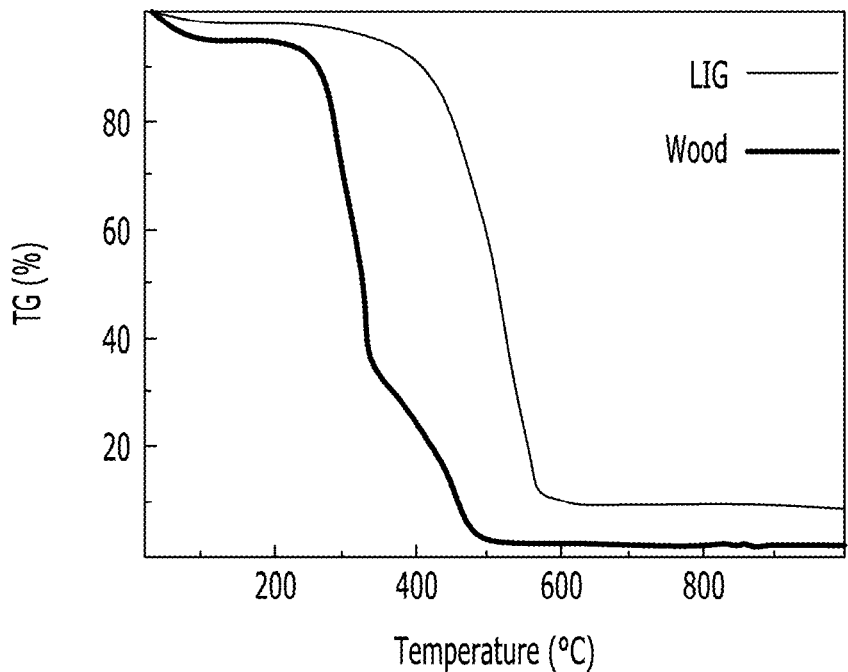

Referring to FIG. 3D, an analysis result of TGA shows that a TGA curve of the wood and thermal stability of the LIG. Here, the wood begins to be decomposed at 240° C., rapidly decomposed until 340° ° C., and finally decomposed at 480° C. In contrast, the most of LIG is decomposed from 400 to 580° ° C., with 10% residual compounds. This result indicates that the LIG has higher thermal stability than the wood. The wood may mainly include lignin which includes aromatic carbons, and cellulose or hemicellulose which includes aliphatic carbons. Aliphatic carbon chains may be easily decomposed at a low temperature between 240 and 340° C. Compared with the carbon chains, aromatic carbon rings may have better thermal stability, and their decomposition rate may thus be reduced at a temperature of 340° C. or more. The LIG may be much more stable than the wood, and thus be decomposed at a higher temperature. In addition, 10% of the graphene in the LIG may be maintained even at a temperature of 1000° C. due to its stable structure.

Figure 4:
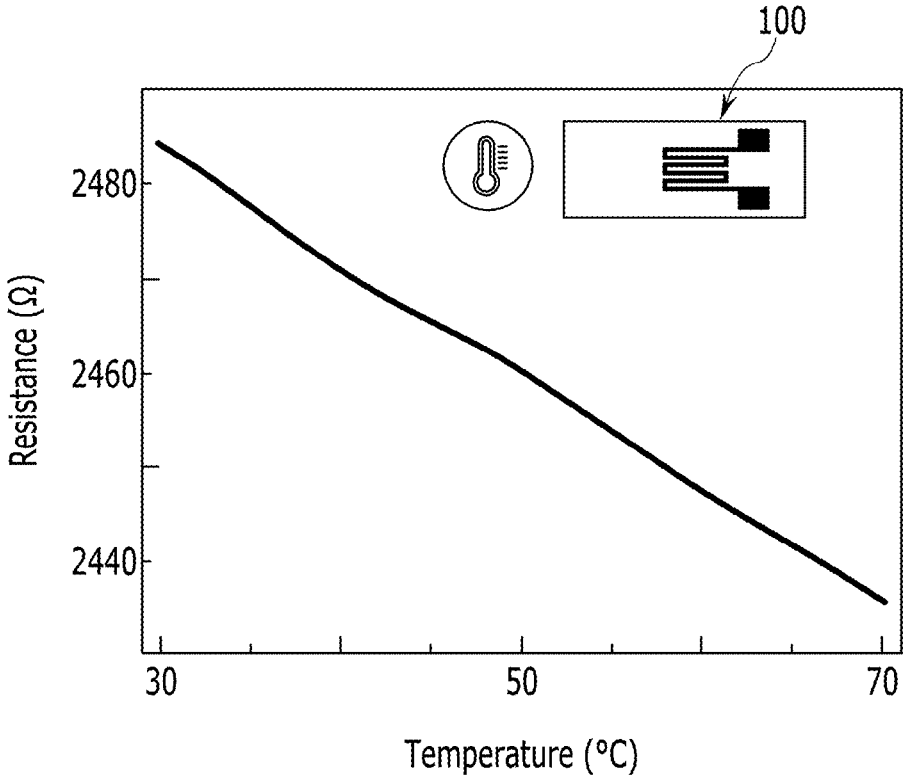
FIG. 4 is a view for explaining an LIG temperature sensor built on wood according to an embodiment.
Figure 5:
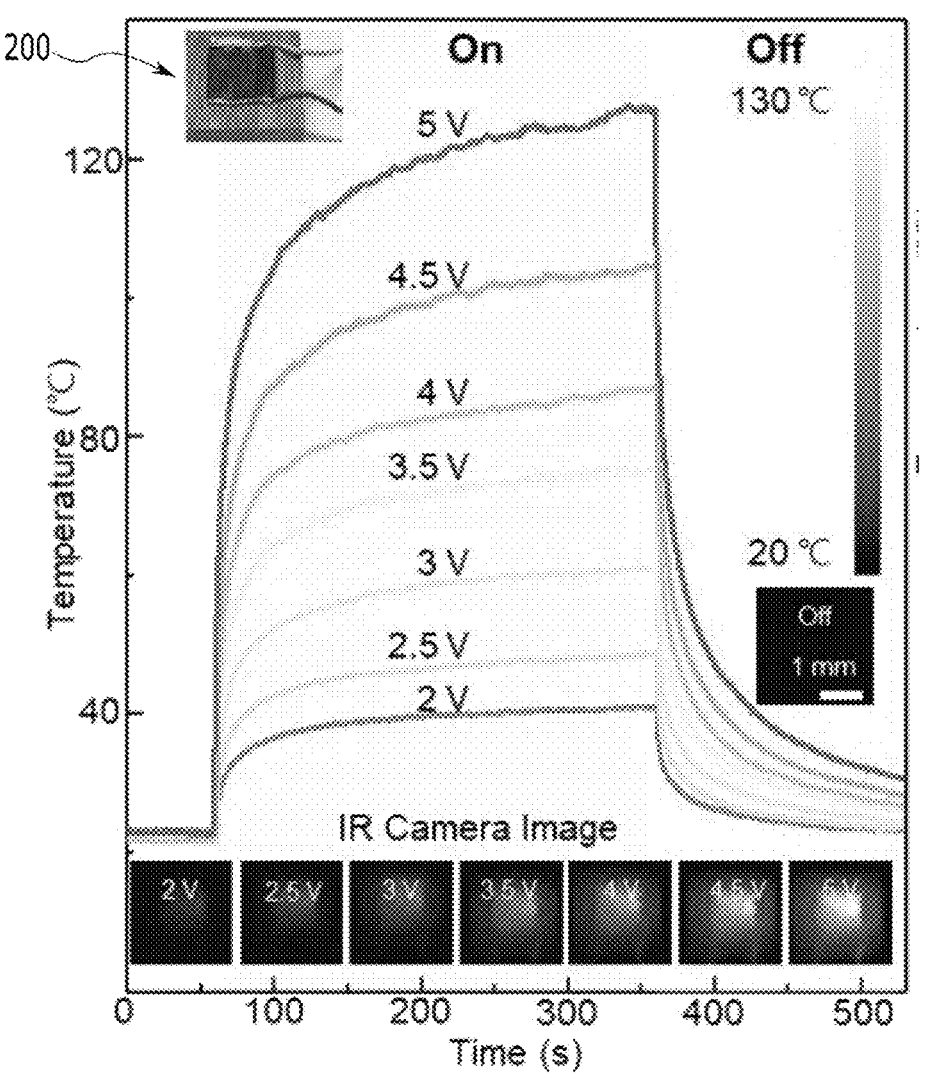
FIG. 5 is a view for explaining an LIG heater built on wood according to an embodiment.

FIG. 4 is a view for explaining the LIG temperature sensor built on wood according to an embodiment; FIG. 5 is a view for explaining the LIG heater built on wood according to an embodiment; and FIG. 6 shows an example of a house where the LIG temperature sensor and the LIG heater are installed according to an embodiment.

Referring to FIG. 4, the temperature sensor 100 may be fabricated by patterning the LIG on the wood by using the femtosecond laser 11. The LIG temperature sensor 100 may be fabricated by patterning the LIG on rubberwood. The LIG temperature sensor 100 may have negative temperature coefficient. The resistance of the LIG temperature sensor 100 may be linearly decreased as its temperature is increased. Therefore, the LIG temperature sensor 100 may be fabricated as a module measuring a LIG resistance, converting the resistance to a temperature, and outputting the same.

Figure 6:
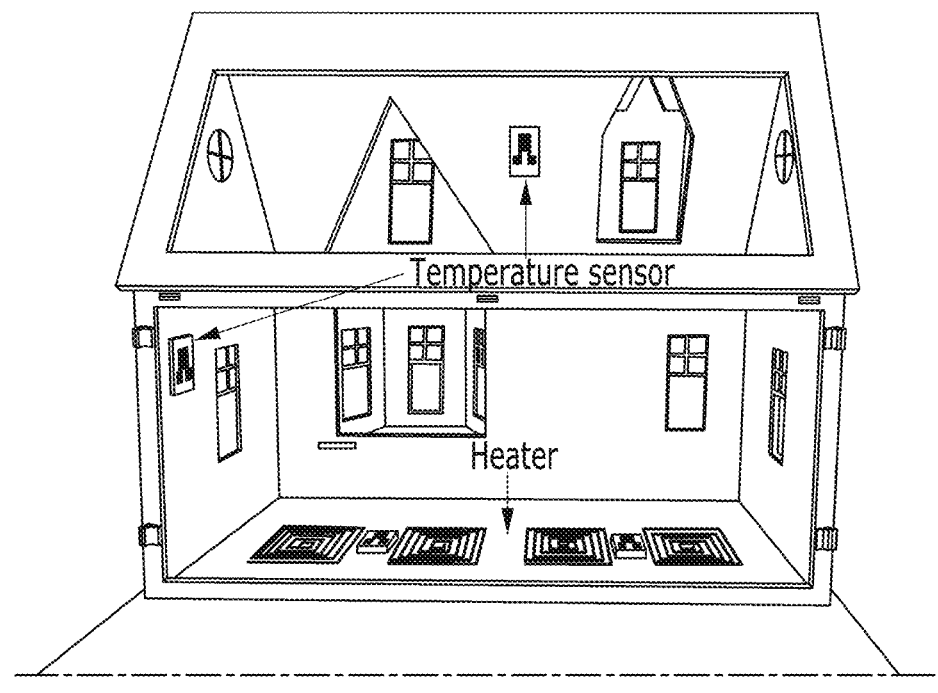
FIG. 6 shows an example of a house where the LIG temperature sensor and the LIG heater are installed according to an embodiment.

Since, the LIG temperature sensor 100 may be fabricated by patterning the LIG on the wood, the sensor 100 may be installed seamlessly in a wooden building as shown in FIG. 6, and the LIGs may be patterned using the femtosecond laser on any wall of the wooden building where a temperature sensor is required. Most wooden buildings may be assembled using wooden boards, and thus avoid additional electrical construction or post-processing installation processes by directly patterning the LIG on the assembled wood.

The sensitivity of the LIG temperature sensor 100 may be similar to that of a conventional platinum sensor or carbon nanotube-based sensor and better than that of a graphene flake-based sensor. Therefore, in a smart green home, the LIG temperature sensor 100 fabricated from wood may control the heater or the boiler without any additional thermistor, and replace a conventional thermistor.

Referring to FIG. 5, a heating system may be one of the most important components of the house, and for its purpose, the heating system may use the LIG heater 200 fabricated by patterning the graphene on the wood using the femtosecond laser 11. The LIG heater 200 may be fabricated in various patterns, including a spiral pattern. As shown in FIG. 6, the plurality of LIG heaters 200 may be installed on a floor and used as a underfloor heating system, or installed on the wall and used as a space heating system. The LIG heater 200 may be fabricated by patterning the LIG on, for example, mulbau wood or bamboo.

In the case of the LIG heater 200, the LIG-based electrodes may be connected to both ends of the patterned LIG, and may be connected to a power supply through this connection. The LIG-based electrodes may provide electric power and convert input electrical energy into the thermal energy according to Joule heating method.

A temperature profile of the LIG heater 200 shows that a temperature of the heater 200 is increased, stabilized, and decreased based on a power supply time, and the temperature depends on a voltage applied thereto. The profile shows that from 2.0 to 4.5 V, the temperature of the LIG electrode is stabilized within 2 minutes at a temperature lower than 100° C., and at 5 V, the temperature is increased to 127.4° C. under a current of 0.33 A and a power of 1.65 W. As an underfloor heater is generally operated at a temperature of 65° C. or less, the LIG heater 200 may be used for underfloor heating.

The LIG boiler may be constructed by applying LIG patterning onto a wooden container, such as bamboo, and subsequently providing power for heating.

Figure 7:
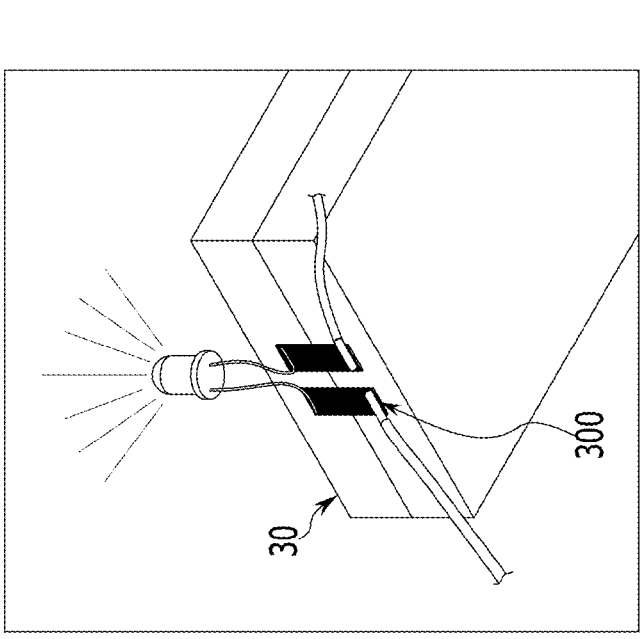
FIG. 7 is a view for explaining an LIG-based electrical interconnects built on wood according to an embodiment.

FIG. 7 is a view for explaining the LIG-based electrical interconnects built on the wood according to an embodiment.

Referring to FIG. 7, the LIG-based electrical interconnects 300 (in detail, 300-1 and 300-2) may be fabricated by patterning the graphene on the wood 30 using the femtosecond laser 11. The LIG-based electrical interconnects 300 may be operated as an electrical wire without any conductive adhesive or conductive material. The electrical interconnects 300 that are electrically connected to each other, with such connections occurring as adjacent wooden boards or wooden blocks are mechanically coupled/assembled, and the joints are patterned with a laser. The electrical interconnects 300 may be fabricated on a wooden board 30-1 and a wooden board 30-1 which ae mechanically coupled/assembled. The LIG-based electrical interconnects 300 may be separated into the LIG-based electrical interconnections 300-1 on the wooden board 30-1 and the LIG-based electrical interconnects 300-2 on the wooden board 30-2. It may be seen that a light emitting diode (LED) emits light when the electrode 300 is connected to the LED, while two wooden boards 30-1 and 30-2 are brought into contact with each other by applying pressure thereto. That is, the LIG-based electrical interconnects may be stably formed on the wooden blocks. Therefore, the LIG-based electrical interconnects may provide the electrical connection in the wooden building.

Figure 8:
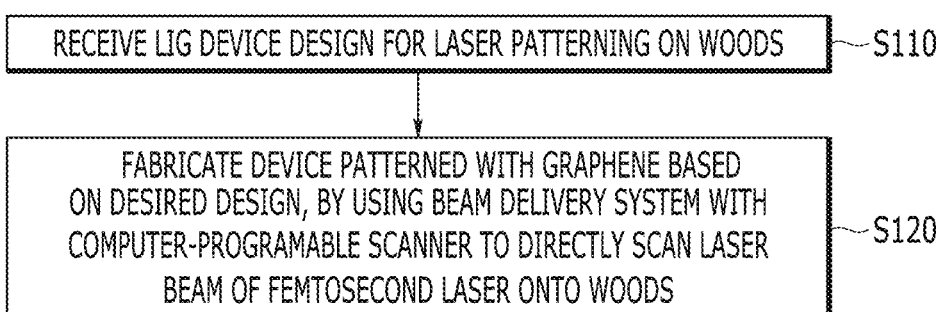
FIG. 8 is a flowchart for explaining a fabrication method of a laser-induced graphene (LIG) device according to another embodiment.

FIG. 8 is a flowchart for explaining a fabrication method of a laser-induced graphene (LIG) device according to another embodiment.

Referring to FIG. 8, a laser system 10 may receive a LIG device design for laser patterning on woods (S110). The device design may be considered based on a LIG device purpose. The graphene pattern may be designed into various shapes. The LIG device may be, for example, an electrical device such as an LIG temperature sensor which detects a temperature by measuring resistance variation, a LIG heater or a LIG boiler, which converts electrical energy to thermal energy, or the like. The LIG device may include electrical interconnects that are electrically connected to each other, with such connections occurring as adjacent wooden boards or wooden blocks are mechanically coupled/assembled, and the joints are patterned with a laser.

The laser system 10 may fabricate the device patterned with graphene based on the desired design, by using a beam delivery system 12 with computer-programmable scanner to directly scan a laser beam of a femtosecond laser 11 onto the woods, (S120). The wood is irradiated with the femtosecond laser 11, it absorbs, reflects, or scatters photon energy, and only the absorbed photons are converted to thermal energy for graphene formation. The femtosecond laser 11 may be a laser outputting an ultrashort femtosecond near-infrared pulse with a high repetition rate. Here, the laser system 10 may create a LIG outline on a border of the graphene electrodes by scanning the laser beam with a low scanning speed (e.g., 5 to 10 mm/s), and fill up the graphene on the inside to create high-quality LIG on the wood by scanning the laser beam with a high scanning speed (e.g., 30 to 50 mm/s).

As set forth above, according to the embodiments, the femtosecond laser with the near-infrared (NIR) wavelength may be used to form the high-quality LIG with excellent electrical conductivity on the wood in the normal environment without any need for the additional treatment of wood or the complex procedure.

According to the embodiments, it is possible to use the wood to fabricate the various electrical components such as the temperature sensor, the heater, the boiler, and the electrode replacing the electric wire, thus making it possible to build the eco-friendly and sustainable smart home.

According to the embodiments, the electric wire may be implemented by mechanically interconnecting the wooden blocks on each of which the LIG is formed without any chemical treatment or conductive adhesive. Therefore, it is possible to simplify the electrical facility in the wood construction, thus lowering the cost. It is also possible to minimize the construction waste such as the wire difficult to be recycled, and activate the development and distribution of the wooden building.

The embodiments of the present disclosure described above are not only implemented through the devices and the methods, and may also be implemented through a program that implements the function corresponding to the configuration of the embodiment of the present disclosure or a recording medium on which the program is recorded.

Although the embodiments of the present disclosure have been described in detail hereinabove, the scope of the present disclosure is not limited thereto. That is, various modifications and alterations made by those skilled in the art by using a basic concept of the present disclosure as defined in the following claims fall within the scope of the present disclosure.

What is claimed is:

1. A laser system comprising:

a femtosecond laser configured to output a laser pulse with a near-infrared wavelength, and a beam delivery system configured to deliver and scan a laser beam emanating from the femtosecond laser onto wood, based on a desired graphene design,

wherein graphene is formed on the wood by the laser beam, and wherein the beam delivery system is further configured to create an outline on a border of graphene electrodes by scanning the laser beam with a lower scanning speed than a reference speed, and filling up the graphene on an inside by scanning the laser beam with a high scanning speed than the reference speed.

2. The system of claim 1, wherein the graphene design is determined based on a device type to be patterned on the wood.

3. The system of claim 2, wherein the device type includes a temperature sensor which detects a temperature by measuring the resistance of the graphene.

4. The system of claim 2, wherein the device type includes a heater or a boiler which converts electrical energy to thermal energy by the Joule heating method.

5. The system of claim 2, wherein the device type includes electrical interconnects.

6. The system of claim 1, wherein the wood includes rubberwood, mulbau wood, or bamboo.

* * * * *